(12) United States Patent
Chang et al.

(10) Patent No.: US 10,451,659 B2
(45) Date of Patent: Oct. 22, 2019

(54) DETECTION CIRCUIT AND ASSOCIATED DETECTION METHOD

(71) Applicant: Realtek Semiconductor Corp., HsinChu (TW)

(72) Inventors: Cheng-Pin Chang, Taipei (TW); Tsung-Peng Chuang, Hsinchu County (TW); Wei-Chieh Wang, Nantou County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/140,513

(22) Filed: Sep. 24, 2018

(65) Prior Publication Data

US 2019/0094274 A1 Mar. 28, 2019

(30) Foreign Application Priority Data

Sep. 26, 2017 (TW) .............................. 106132924 A

(51) Int. Cl.
| | |
|---|---|
| *G01R 19/165* | (2006.01) |
| *G01R 27/14* | (2006.01) |
| *H04R 29/00* | (2006.01) |
| *H04R 1/10* | (2006.01) |
| *H04R 5/04* | (2006.01) |
| *H04R 25/00* | (2006.01) |

(52) U.S. Cl.
CPC . *G01R 19/16538* (2013.01); *G01R 19/16576* (2013.01); *G01R 27/14* (2013.01); *H04R 1/1041* (2013.01); *H04R 29/004* (2013.01); *H04R 5/04* (2013.01); *H04R 25/30* (2013.01)

(58) Field of Classification Search
CPC .... G01R 31/025; G01R 31/389; G01R 31/40; G01R 19/16538; G01R 19/155; G01R 19/16528; G01R 19/16576; G01R 27/025
USPC ................................. 327/142, 143, 198, 333
See application file for complete search history.

(56) References Cited

U.S. PATENT DOCUMENTS

| | | | |
|---|---|---|---|
| 5,512,837 A | * | 4/1996 | Ohnishi ........... G01R 19/16538 324/704 |
| 2012/0019291 A1 | * | 1/2012 | Hirai .................... H03K 17/223 327/143 |

FOREIGN PATENT DOCUMENTS

| | | |
|---|---|---|
| CN | 102378087 A | 3/2012 |
| TW | 200944034 A1 | 10/2009 |

* cited by examiner

*Primary Examiner* — John W Poos
(74) *Attorney, Agent, or Firm* — Winston Hsu

(57) ABSTRACT

A detection circuit of an electronic device includes a resistance detecting circuit and a voltage supplying circuit, wherein the detecting circuit is coupled to an input circuit which is coupled to the electronic device and comprises a plurality of resistors respectively coupled to a plurality of switches, wherein the resistance detecting circuit is arranged to detect whether the input circuit has a resistance variation and generate a detecting signal indicative of the resistance variation; and the voltage supplying circuit is coupled to the resistance detecting circuit to supply a first voltage signal, wherein the voltage supplying circuit receives the detecting signal, and selectively switches the first voltage signal to a second voltage signal according to the detecting signal; wherein the resistance detecting circuit determines whether at least one of the plurality of switches is closed according to the second voltage signal.

18 Claims, 3 Drawing Sheets

DETECTION CIRCUIT AND ASSOCIATED DETECTION METHOD

BACKGROUND OF THE INVENTION

1. Field of the Invention

The present invention relates to a detection circuit, and more particularly, to a resistance detecting circuit for detecting the buttons of a headphone, and an associated detection method.

2. Description of the Prior Art

For electronic devices such as a smart phone or tablet, the device dimensions are designed to be small and thin for a user's convenience. Reducing the dimensions, however, restricts the dimensions of the battery therein. To extend the battery life and standby time of the device, circuits within the device are required to reduce their power consumption. When using the electronic device, a user often uses a headphone (certain headphones include at least a microphone) that connects to the electronic device. Conventionally, when the headphone connects to the electronic device, a fixed voltage is provided to the microphone of the headphone. This fixed voltage may cause unnecessary power consumption in some cases.

SUMMARY OF THE INVENTION

One of the objectives of the present invention is therefore to provide a detection circuit and an associated method to solve the aforementioned problem.

According to an embodiment of the present invention, a detection circuit adapted for an electronic device is disclosed, comprising: a resistance detecting circuit and a voltage supplying circuit. The resistance detecting circuit is arranged to detect an input circuit coupled to the electronic device; the input circuit comprises a plurality of resistors respectively coupled to a plurality of switches, wherein the resistance detecting circuit detects a resistance variance of the input circuit and generates a detecting signal indicative of the resistance variance; and the voltage supplying circuit is coupled to the resistance detecting circuit to provide a first voltage signal, wherein the voltage supplying circuit receives the detecting signal and selectively switches the first voltage signal to a second voltage signal according to the detecting signal; and the resistance detecting circuit determines if at least one switch in the plurality of switches is activated according to the second voltage signal.

According to an embodiment of the present invention, a detection method adapted for an electronic device is disclosed, comprising: detecting if an input circuit of the electronic device generates a resistance variance, and generating a detecting signal indicative of resistance variance, wherein the input circuit comprises a plurality of resistors respectively coupled to a plurality of switches; providing a first voltage signal; receiving the detecting signal and selectively switching the first voltage signal to a second voltage according to the detecting signal; and determining if at least one switch of the plurality of switches is activated according to the second voltage signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
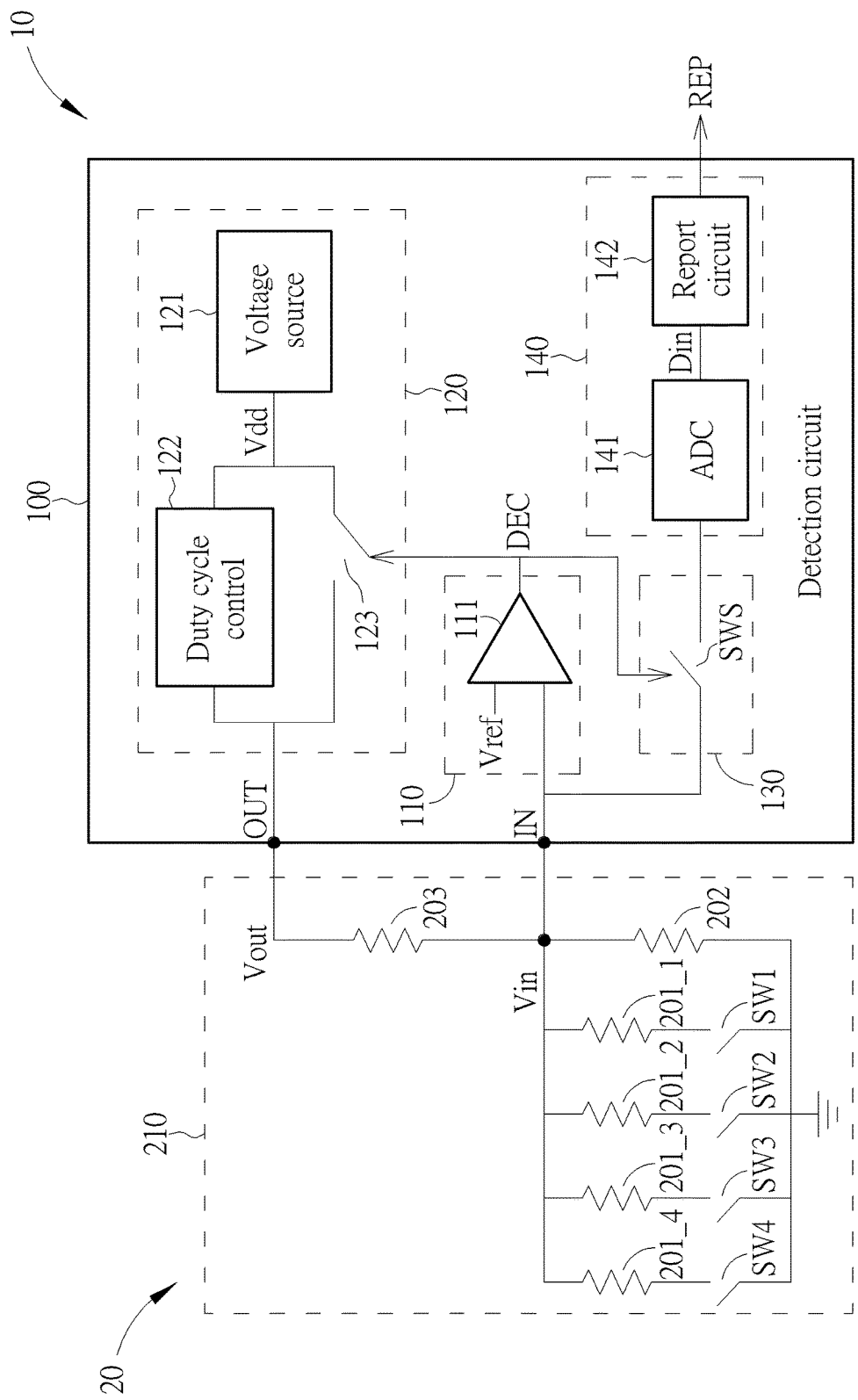
FIG. 1 is a diagram illustrating a detection circuit installed within an electronic device for detecting a headphone according to an embodiment of the present invention.

FIG. 1 is a diagram illustrating a detection circuit 100 installed within an electronic device 10 for detecting a headphone 20 according to an embodiment of the present invention. As shown in FIG. 1, the headphone 20 comprises an input circuit 210 consisting of fixed resistors 202 and 203, resistors 201_1-201_4 and corresponding switches SW1-SW4, wherein one terminal of the fixed resistor 203 is coupled to an output terminal OUT of the electronic device 10 and the other terminal is coupled to a terminal of the fixed resistor 202 and input terminal of the electronic device 10. In this embodiment, the fixed resistor 202 may be an alternative implementation for an attached microphone of the headphone 20. As mentioned in the prior art, the electronic device 10 provides an voltage signal Vout to the headphone 20 via the output terminal OUT, and the fixed resistors 202 and 203 execute voltage division upon the voltage signal Vout and generate an input voltage Vin on an input terminal IN; the resistors 201_1-201_4 and the corresponding switches SW1-SW4 constitute a resistor block whose connection is shown in FIG. 1. In addition, in this embodiment, the switches SW1-SW4 may be an alternative implementation for four buttons attached on the headphone 20. For example, a headphone typically comprises buttons such as volume up, volume down, etc. When one of the buttons (e.g. the switch SW1) of the headphone 20 is pressed, the switch SW1 is activated, and the path through the corresponding resistor 201_1 becomes conductive, which means the output terminal OUT of the electronic device 10 receives the voltage signal Vout, thereby making the resistor 201_1 and the fixed resistor 202 connect in parallel. The input circuit 201 accordingly generates a resistance variance or change. It should be noted that the headphone 20 is not limited to attach four buttons, i.e. the switches SW1-SW4. In other embodiments, the headphone 20 may attach to more or less than four buttons; and the number of corresponding resistors is not limited in the present invention.

The detection circuit 100 comprises a resistance detecting circuit 110, a voltage supplying circuit 120, a switching circuit 130 and a processing circuit 140. The resistance detecting 110 is coupled to the headphone 20 via the input terminal IN of the electronic device 10. In this embodiment, the input terminal IN is a headphone jack, and the resistance detecting circuit 110 comprises a comparing circuit 111 arranged to compare a voltage Vin on the input terminal In to a reference voltage Vref for detecting if the input circuit 210 of the headphone 20 generates a resistance variance or change, and generating a detecting signal DEC accordingly. In this embodiment, the comparing circuit 111 is implemented by a comparator; however, this is not a limitation of the present invention. For example, when the headphone 20 connects to the electronic device 10 via the input terminal, when none of the buttons on the headphone 20 are pressed (i.e. none of the switches SW1-SW4 are switched on), the comparing circuit 111 of the resistance detecting circuit 110 compares the input voltage Vin to the reference voltage Vref, and outputs the detecting DEC which is a specific logic value. For example, when the input voltage Vin is greater than the reference voltage Vref, the logic value of the detecting signal DEC is '1'; when one of the switches SW1-SW4 is activated, e.g. the switch SW1, the corresponding resistor 201_1 and the fixed resistor 202 connect in parallel, and the input voltage Vin decreases due to the voltage division. The logic value of the detecting signal DEC accordingly becomes '0'. In other words, when none of the buttons on the headphone 20 is being pressed, the detecting signal DEC outputs logic value '1', and when any button on the headphone 20 is being pressed, the detecting signal DEC outputs logic value '0', and the resistance detecting circuit 110 transmits the detecting signal DEC to the voltage supplying circuit 120 and the switching circuit 130. This is only for illustrative purposes, and not a limitation of the present invention. In other embodiments, the detecting signal DEC outputs logic value '0' when any button is pressed, and outputs logic value '1' when none of the buttons is pressed. Those skilled in the art should readily understand the implementation of the logic circuit. The detailed description is therefore omitted here.

Figure 2:
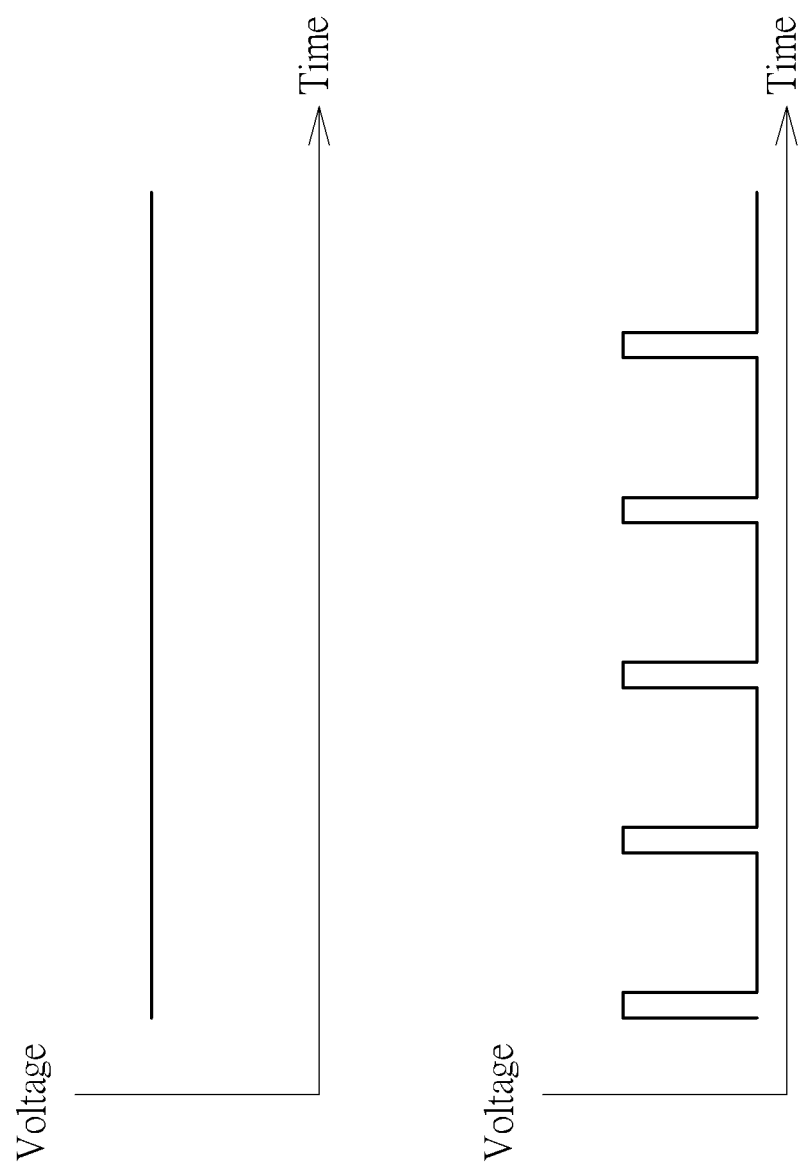
FIG. 2 is a diagram illustrating a fixed voltage being a DC voltage or transformed by the duty cycle control circuit according to an embodiment of the present invention.

The voltage supplying circuit 120 comprises a voltage source 121, a duty cycle control circuit 122 and a switch 123. The voltage source 121 is arranged to provide a fixed voltage Vdd which is a direct current (DC) voltage. The switch 123 is a bypass circuit arranged to receive the detecting signal DEC generated by the resistance detecting circuit 110, and a state of the switch 123 is selectively switched according to the logic value of the detecting signal DEC. When the switch 123 is activated, as a bypass circuit, the fixed voltage Vdd provided by the voltage source 121 is output to the output terminal OUT of the electronic device 10 as the output voltage Vout; when the switch 123 is deactivated, the fixed voltage Vdd is output to the output terminal OUT via the duty cycle control circuit 122 as the output voltage Vout, wherein the duty cycle control circuit 122 is arranged to adjust a duty cycle of the fixed voltage Vdd to transform the fixed voltage, which is originally a DC voltage, into a voltage signal in a square wave form. Refer to FIG. 2, which is a diagram illustrating the fixed voltage Vdd being a DC voltage and being transformed into the voltage signal in the square wave form with a duty cycle by the duty cycle control circuit 122. It should be noted that the width of the duty cycle of the transformed signal is not limited in the present invention.

More specifically, when the headphone 20 connects to the electronic device 10 via the input terminal IN, if none of the switches SW1-SW4 is switched, the comparing circuit 111 of the resistance detecting circuit 110 compares the input voltage Vin to the reference voltage Vref, and outputs the detecting signal DEC which is the logic value '1' to the voltage supplying circuit 120. At this point, the switch 123 receives the detecting signal DEC and stays activated. The duty cycle control circuit 122 accordingly outputs a voltage signal in a square wave form with a duty cycle to the output terminal OUT of the electronic device 10 as the output voltage Vout. When one of the switches SW1-SW4 is activated, e.g. the switch SW1, the corresponding resistor 201_1 connects to the fixed resistor 202 in parallel, and the input voltage Vin decreases due to the voltage division. The comparing circuit 111 then determines the variance or change of the input voltage Vin by comparing it to the reference voltage Vref. The detecting signal DEC which is the logic value '0' is generated. At this point, the switch 123 is activated after the detecting signal DEC is received, and outputs the fixed voltage Vdd which is a DC voltage signal to the output terminal OUT as the output voltage Vout. In this way, the problem of providing a fixed power to the attached microphone of the headphone in the prior art can be solved by adjusting the fixed voltage Vdd into a voltage signal in a square wave form with a duty cycle as proposed by the present invention. When any button on the headphone is pressed, the fixed voltage Vdd is provided to the headphone 20 by the voltage supplying circuit 120 of the electronic device 10 via the detecting signal DEC.

Referring to FIG. 1 again, the switching circuit 130 couples to the resistance detecting circuit 110 and the input terminal IN, wherein the switching circuit 130 comprises a switch SW5 which is a bypass circuit for receiving the detecting DEC and determining if the input voltage Vin should be transmitted to a processing circuit 140. More specifically, when any of the switches SW1-SW4 is activated, e.g. the switch SW1, the corresponding resistor 201_1 connects to the fixed resistor 202 in parallel, and the input voltage Vin decreases due to the voltage division. At this point, the comparing circuit determines the variance or change of the input voltage Vin by comparing it to the reference voltage Vref, and generates the detecting DEC which is the logic value '0'. The switch SW5 is activated after the detecting signal DEC is received, and bypasses the input voltage Vin to the processing circuit 140. It should be noted that the resistance of the resistors 201_1-201_4 are different with one another; hence, when any of the corresponding switches SW1-SW4 is or are activated, the value of the reduction of the input voltage Vin can be different. The processing circuit 140 comprises an analog-to-digital converter (ADC) 141 and a report circuit 142. When the resistance detecting circuit 110 detects the resistance variance or change of the input circuit 210, i.e. the buttons on the headphone 20 are pressed, the detecting signal DEC activates the switch SW5 to input the input voltage Vin to the ADC 141, and the ADC 141 generates a digital calculating result Din to the report circuit 142 according to the input voltage Vin. The report circuit 142 generates a report result REP according to the digital calculating result Din, and transmits the report result REP to the backend circuit (not shown in FIG. 1) of the electronic device 10, wherein the report result REP reports which button on the headphone 20 is being pressed.

Figure 3:
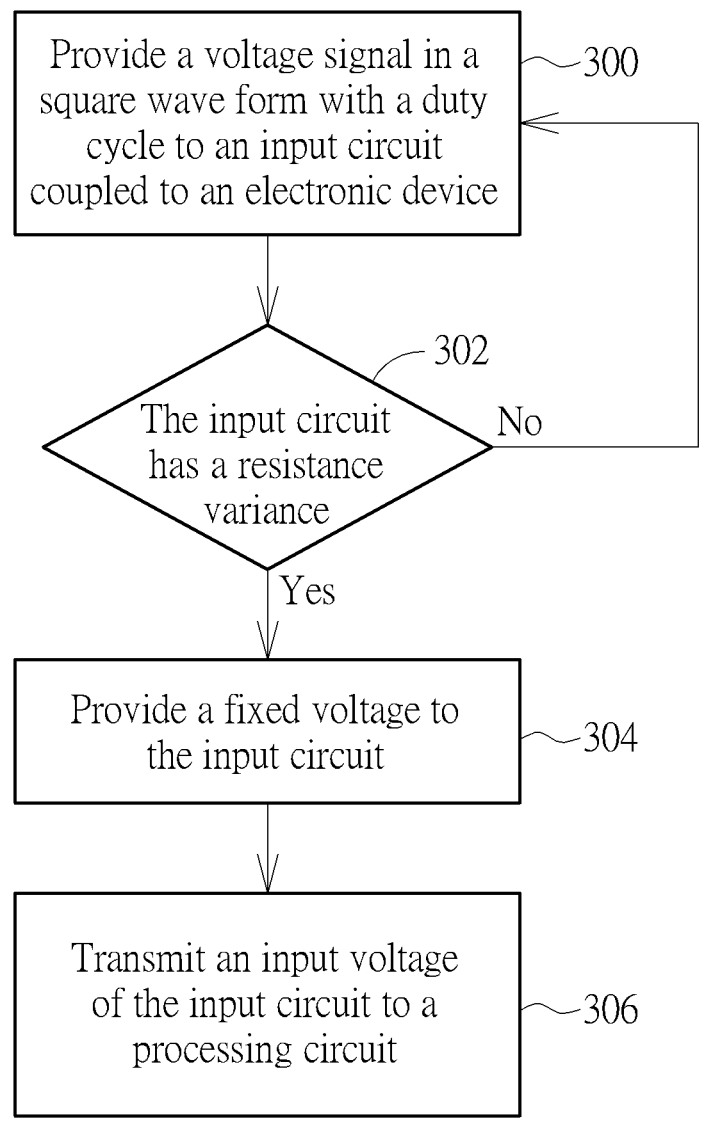
FIG. 3 is a flowchart illustrating a resistance detecting method according to an embodiment of the present invention.

FIG. 3 is a flowchart illustrating the resistance detecting method according to an embodiment of the present invention. Provided that the result is substantially the same, the steps are not required to be executed in the exact order shown in FIG. 3. The wireless resistance detecting method is summarized as follows.

Step 300: provide a voltage signal in a square wave form with a duty cycle to an input circuit coupled to an electronic device.

Step 302: detect if the input circuit has a resistance variance or change. If yes, go to step 304; otherwise, go to step 300.

Step 304: provide a fixed voltage to the input circuit.

Step 306: transmit an input voltage of the input circuit to a processing circuit.

Those skilled in the art should readily understand the operation shown in FIG. 3 after reading the paragraphs above; the detailed description is therefore omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A detection circuit adapted for an electronic device, comprising:
a resistance detecting circuit, arranged to detect an input circuit coupled to the electronic device, the input circuit comprising a plurality of resistors respectively coupled to a plurality of switches, wherein the resistance detecting circuit is arranged to detect a resistance variance of the input circuit and generate a detecting signal indicative of the resistance variance; and
a voltage supplying circuit, coupled to the resistance detecting circuit to provide a first voltage signal, wherein the voltage supplying circuit receives the detecting signal, and selectively switches the first voltage signal to a second voltage signal according to the detecting signal;
wherein the resistance detecting circuit determines if at least one switch in the plurality of switches is activated according to the second voltage signal;
wherein one of the first voltage signal and the second voltage signal is a voltage signal in a square wave form having a duty cycle, and when the detecting signal indicates that the input circuit does not generate the resistance variance, the voltage supplying circuit provides the voltage signal in the square wave form to the input circuit.

2. The detection circuit of claim 1, wherein the first voltage signal has a first signal pattern, and the second voltage signal has a second signal pattern different from the first signal pattern.

3. The detection circuit of claim 2, wherein one of the first signal pattern and the second signal pattern is a direct current (DC) voltage signal, and when the detecting signal indicates that the input circuit generates the resistance variance, the voltage supplying circuit provides the DC voltage signal to the input circuit.

4. The detection circuit of claim 1, wherein the input circuit couples to the electronic device via at least one input terminal, and the resistance detecting circuit comprises:
a comparing circuit, coupled to the input terminal, wherein the comparing circuit receives an input voltage of the input circuit via the input terminal, and compares the input terminal to a reference voltage to generate the detecting signal;
wherein the input voltage of the input circuit corresponds to the resistance variance of the input circuit.

5. The detection circuit of claim 4, further comprising:
a switching circuit, coupled to the resistance detecting circuit, wherein the switching circuit is arranged to receive the detecting signal, and selectively switch a state of a switch of the switching circuit according to the detecting signal.

6. The detection circuit of claim 5, further comprising:
a processing circuit, coupled to the switching circuit, wherein when the detecting signal indicates that the input circuit generates the resistance variance, the switching circuit couples the processing circuit to the input terminal and generates a report signal according to the input voltage;
wherein the report signal indicates a resistance variance of the input circuit.

7. The detection circuit of claim 6, wherein the processing circuit comprises:
an analog-to-digital converter (ADC), arranged to receive the input voltage and generate a digital calculating result according to the input voltage; and
a report circuit, coupled to the ADC, wherein the report circuit is arranged to receive the digital calculating result and report the report signal.

8. A detection circuit adapted for an electronic device, comprising:
a resistance detecting circuit, arranged to detect an input circuit coupled to the electronic device, the input circuit comprising a plurality of resistors respectively coupled to a plurality of switches, wherein the resistance detecting circuit is arranged to detect a resistance variance of the input circuit and generate a detecting signal indicative of the resistance variance; and
a voltage supplying circuit, coupled to the resistance detecting circuit to provide a first voltage signal, wherein the voltage supplying circuit receives the detecting signal, and selectively switches the first voltage signal to a second voltage signal according to the detecting signal;
wherein the resistance detecting circuit determines if at least one switch in the plurality of switches is activated according to the second voltage signal;
wherein the voltage supplying circuit comprises:
a voltage source, arranged to provide a direct current (DC) voltage signal;
a duty cycle control circuit, coupled to the voltage source, wherein the duty cycle control circuit is arranged to adjust a duty cycle of the DC voltage signal to generate a voltage signal in a square wave form; and
a switching circuit, coupled to the resistance detecting circuit, wherein the switching circuit receives the detecting signal and selectively outputs the DC voltage signal or the voltage signal in the square wave form to an output terminal of the voltage supplying circuit according to the detecting signal.

9. The detection circuit of claim 1, wherein the resistance variance is a change in resistance.

10. A detection method adapted for an electronic device, comprising:
detecting if an input circuit of the electronic device generates a resistance variance and generating a detecting signal indicative of resistance variance, wherein the input circuit comprises a plurality of resistors respectively coupled to a plurality of switches;
providing a first voltage signal;
receiving the detecting signal and selectively switching the first voltage signal to a second voltage according to the detecting signal; and determining if at least one switch of the plurality of switches is activated according to the second voltage signal;

wherein one of the first voltage signal and the second voltage signal is a voltage signal in a square wave form having a duty cycle, further comprising:

when the detecting signal indicates that the input circuit does not generate the resistance variance, providing the voltage signal in the square wave form to the input circuit.

11. The detection method of claim 10, wherein the first voltage signal has a first signal pattern, and the second voltage signal has a second signal pattern different from the first signal pattern.

12. The detection method of claim 11, wherein one of the first signal pattern and the second signal pattern is a direct current (DC) voltage signal, further comprising:

when the detecting signal indicates that the input circuit generates the resistance variance, providing the DC voltage signal to the input circuit.

13. The detection method of claim 10, wherein the input circuit couples to the electronic device via at least one input terminal, further comprising:

receiving an input voltage of the input circuit via the input terminal; and comparing the input voltage and a reference voltage to generate the detecting signal;

wherein the input voltage of the input circuit corresponds to the resistance variance of the input circuit.

14. The detection method of claim 13, further comprising:
receiving the detecting signal and selectively switching a state of a switch according to the detecting signal.

15. The detection method of claim 14, further comprising:
when the detecting signal indicates the input circuit generates the resistance variance, switching the switch to couple to a processing circuit to the input terminal; and utilizing the processing circuit to execute at least one operation upon the input voltage to generate a report signal;

wherein the report signal indicates a resistance variance of a variable resistor block comprised in the input circuit.

16. The detection method of claim 15, wherein the steps of utilizing the processing circuit to execute the at least one operation upon the input voltage to generate the report signal comprising:

executing an analog-to-digital converting operation upon the input voltage to generate a digital calculating result; and receiving the digital calculating result and generating the report signal according to the digital calculating result.

17. The detection method of claim 9, further comprising:
providing a direct current (DC) voltage signal;
adjusting a duty cycle of the DC voltage signal to generate a voltage signal in a square wave form; and
receiving the detecting signal and selectively outputting the DC voltage signal or the voltage signal in the square wave form to an output terminal.

18. The detection method of claim 10, wherein the resistance variance is a change in resistance.

* * * * *